US010958236B2

(12) United States Patent
Li et al.

(10) Patent No.: US 10,958,236 B2
(45) Date of Patent: Mar. 23, 2021

(54) HYBRID ACOUSTIC WAVE RESONATOR AND PREPARATION METHOD THEREFOR

(71) Applicant: EPIC MEMS (XIAMEN) CO., LTD, Fujian (CN)

(72) Inventors: Ping Li, Fujian (CN); Nianchu Hu, Fujian (CN); Bin Jia, Fujian (CN)

(73) Assignee: EPIC MEMS (XIAMEN) CO., LTD, Fujian (CN)

( * ) Notice: Subject to any disclaimer, the term of this patent is extended or adjusted under 35 U.S.C. 154(b) by 0 days.

(21) Appl. No.: 16/768,691

(22) PCT Filed: Nov. 12, 2018

(86) PCT No.: PCT/CN2018/115041
§ 371 (c)(1),
(2) Date: Jun. 1, 2020

(87) PCT Pub. No.: WO2020/087566
PCT Pub. Date: May 7, 2020

(65) Prior Publication Data
US 2020/0389146 A1 Dec. 10, 2020

(30) Foreign Application Priority Data
Oct. 30, 2018 (CN) .......................... 201811277386.5

(51) Int. Cl.
*H03H 9/02* (2006.01)
*H03H 9/205* (2006.01)
*H03H 9/17* (2006.01)
(52) U.S. Cl.
CPC .... *H03H 9/02015* (2013.01); *H03H 9/02102* (2013.01); *H03H 9/02228* (2013.01); *H03H 9/173* (2013.01); *H03H 9/205* (2013.01)

(58) Field of Classification Search
CPC .......... H03H 9/02015; H03H 9/02102; H03H 9/02228; H03H 9/173; H03H 9/205
See application file for complete search history.

(56) References Cited

U.S. PATENT DOCUMENTS 10,079,589 B2 * 9/2018 Lee ........................ H03H 9/173
2007/0024396 A1 2/2007 Nam et al.
(Continued)

FOREIGN PATENT DOCUMENTS

CN 106411355 A 2/2017
CN 107422031 A 12/2017
(Continued)

OTHER PUBLICATIONS

International Search Report for PCT/CN2018/115041 dated Jul. 25, 2019, ISA/CN.

*Primary Examiner* — Samuel S Outten
(74) *Attorney, Agent, or Firm* — Yue (Robert) Xu; Apex Attorneys at Law, LLP

(57) ABSTRACT

A hybrid acoustic resonator. An interdigital electrode is provided in a first region of a surface of a piezoelectric film facing away from a substrate, and forms an interdigital transducer. At least two trenches are provided in a second region of the surface of the piezoelectric film facing away from the substrate. A bulk-acoustic-wave propagation portion is formed between adjacent trenches. A bulk-acoustic-wave electrode is provided on a side surface of the bulk-acoustic-wave propagation portion, and there is an air gap at a surface of the bulk-acoustic-wave electrode facing away from the bulk-acoustic-wave propagation portion. Thereby, the hybrid acoustic resonator includes both the surface acoustic resonator and the bulk acoustic resonator. An acoustic wave in the bulk-acoustic-wave propagation por-
(Continued)

tion and an acoustic wave in the interdigital transducer are both transmitted along a transversal direction.

15 Claims, 10 Drawing Sheets

(56) References Cited

U.S. PATENT DOCUMENTS

| | | | |
|---|---|---|---|
| 2012/0297595 A1 | 11/2012 | Inoue et al. | |
| 2013/0106243 A1* | 5/2013 | Reinhardt | H03H 3/02 310/313 B |
| 2013/0321100 A1 | 12/2013 | Wang | |
| 2016/0380608 A1 | 12/2016 | Ni et al. | |
| 2017/0214381 A1* | 7/2017 | Bhattacharjee | H03H 9/0538 |
| 2019/0190488 A1* | 6/2019 | Dasgupta | H03H 9/205 |
| 2019/0273480 A1* | 9/2019 | Lin | H03H 9/02228 |
| 2019/0348966 A1* | 11/2019 | Campanella-Pineda | H03H 3/02 |

FOREIGN PATENT DOCUMENTS

| | | |
|---|---|---|
| CN | 108173531 A | 6/2018 |
| JP | 4324182 B2 | 9/2009 |

\* cited by examiner though this application is the national phase of International Application No. PCT/CN2018/115041, titled "HYBRID ACOUSTIC RESONATOR AND METHOD FOR MANUFACTURING THE SAME", filed on Nov. 12, 2018, which claims priority to Chinese Patent Application No. 201811277386.5, titled "HYBRID ACOUSTIC RESONATOR AND METHOD FOR MANUFACTURING THE SAME", filed on Oct. 30, 2018 with the China National Intellectual Property Administration, which is incorporated herein by reference in its entirety.

HYBRID ACOUSTIC WAVE RESONATOR AND PREPARATION METHOD THEREFOR

FIELD

The present disclosure relates to the technical field of resonators, and in particular, to a hybrid acoustic resonator and a method for manufacturing the hybrid acoustic resonator.

BACKGROUND

Mobile terminals such as mobile phones are becoming more and more popular, with a continuous progress of science and technology as well as development of the communication industry in recent years. A filter serves as an indispensable radio frequency device in the mobile terminal, and is widely used in the mobile terminal.

With development of mobile communication technology, data transmission rate is increasingly fast, a frequency spectrum is increasingly crowded, and thereby it is necessary to provide more frequency bands for mobile communication. An increase of frequency bands in communication means more filters required in mobile terminals, especially smart phones, to ensure no interference among the frequency bands. At present, there are more than 50 filters in a flagship type of a smartphone that supports 4G communication, and the quantity would be multiplied in near future. Although the quantity of filters keeps increasing, a layout area for devices in the smart phone does not increase significantly. Therefore, it is necessary to further miniaturize and modularize the filters while ensuring high performances.

Currently, the filters mainly include surface acoustic wave filters and bulk acoustic wave filters. The surface acoustic wave device is mainly applied to low frequency band below 2 GHz, and the bulk acoustic wave device is mainly applied to high frequency band above 2 GHz. It is necessary to further reduce the size of filters as the quantity of filters in smartphones increases. Resonator is a basic unit of the filter. Therefore, it is a problem to be solved by those skilled in the art how to integrate different resonators on a same substrate, so as to reduce the area occupied by the filters while meeting different requirements.

SUMMARY

An object of the present disclosure is to provide a hybrid acoustic resonator, where multiple different types of resonator structures are integrated on a same substrate. Another object of the present disclosure is to provide a method for manufacturing a hybrid acoustic resonator, where multiple different types of resonator structures are integrated on a same substrate in the hybrid acoustic resonator.

In order to address the above technical issue, a hybrid acoustic resonator is provided according to an embodiment of the present disclosure, including:

a substrate;
a piezoelectric film on a surface of the substrate;
an interdigital electrode located in a first region of a surface of the piezoelectric film facing away from the substrate;
at least two trenches located in a second region of the surface of the piezoelectric film facing away from the substrate, where a bulk-acoustic-wave propagation portion is formed between adjacent ones of the at least two trenches, and the bulk-acoustic-wave propagation portion includes two side surfaces opposite to each other; and
bulk-acoustic-wave electrodes located on the two side surfaces of the bulk-acoustic-wave propagation portion, respectively, where there is an air gap at a surface of each of the bulk-acoustic-wave electrodes facing away from the bulk-acoustic-wave propagation portion.

Optionally, the piezoelectric film is a single crystal piezoelectric film.

Optionally, the at least two trenches are parallel to each other.

Optionally, a width of the air gap is not less than 2 µm.

Optionally, the resonator further includes:
a dielectric layer located between the substrate and the piezoelectric film, where a temperature coefficient of frequency of the dielectric layer is positive.

Optionally, the resonator further includes:
multiple first pads and multiple second pads, located on the surface of the piezoelectric film facing away from the substrate, where the multiple first pads are electrically connected to a bus of the interdigital electrode, and the multiple second pads are electrically connected to the bulk-acoustic-wave electrodes.

A method for manufacturing a hybrid acoustic resonator is further provided according to an embodiment of the present disclosure, including:

providing a piezoelectric film on a surface of a substrate;
providing an interdigital electrode in a first region of a surface of the piezoelectric film;
etching at least two trenches in a second region of the surface of the piezoelectric film, where a bulk-acoustic-wave propagation portion is formed between adjacent ones of the at least two trenches, and the bulk-acoustic-wave propagation portion includes two side surfaces opposite to each other;
providing bulk-acoustic-wave electrodes in the at least two trenches to form the hybrid acoustic resonator, where the bulk-acoustic-wave electrodes are located at the two side surfaces of the bulk-acoustic-wave propagation portion, respectively, and there is an air gap at a surface of each of the bulk-acoustic-wave electrodes facing away from the bulk-acoustic-wave propagation portion.

Optionally, providing the bulk-acoustic-wave electrodes in the at least two trenches includes:
providing a conductive layer in the at least two trenches; and
patterning the conductive layer, to form the air gap and the bulk-acoustic-wave electrodes.

Optionally, before providing the piezoelectric film on the surface of the substrate, the method further includes:
providing a dielectric layer on the surface of the substrate, where the temperature coefficient of frequency of the dielectric layer is positive; and
providing the piezoelectric film on the surface of the substrate includes:

bonding the piezoelectric film to a surface of the dielectric layer.

Optionally, after providing the interdigital electrode in the first region of the surface of the piezoelectric film, the method further includes:

providing a protection layer covering the interdigital electrode in the first region of the surface of the piezoelectric film;

etching the at least two trenches in the second region of the surface of the piezoelectric film includes:

etching, after providing the interdigital electrode, the at least two trenches in the second region of the surface of the piezoelectric film; and after providing the interdigital electrode in the first region of the surface of the piezoelectric film, the method further includes:

removing the protection layer.

The hybrid acoustic resonator is provided according to an embodiment of the present disclosure. The interdigital electrode is provided in the first region of the surface of the piezoelectric film facing away from the substrate, and forms an interdigital transducer. Hence, the hybrid acoustic resonator includes a surface acoustic resonator. The at least two trenches are provided in the second region of the surface of the piezoelectric film facing away from the substrate. The bulk-acoustic-wave propagation portion is formed between adjacent trenches. The bulk-acoustic-wave electrode is provided on the side surface of the bulk-acoustic-wave propagation portion, and there is the air gap at the surface of the bulk-acoustic-wave electrode facing away from the bulk-acoustic-wave propagation portion. The air gap, the bulk-acoustic-wave electrode, and the bulk-acoustic-wave propagation portion constitute a bulk acoustic resonator. Thereby, the hybrid acoustic resonator includes both the surface acoustic resonator and the bulk acoustic resonator, achieving an integration of different types of resonators. In addition, an acoustic wave in the bulk-acoustic-wave propagation portion and an acoustic wave in the interdigital transducer are both transmitted along a transversal direction. Good performances of both the surface acoustic resonator and the bulk acoustic resonator are ensured in the same substrate.

The method for manufacturing the hybrid acoustic resonator is further provided according to an embodiment of the present disclosure. The manufactured hybrid acoustic resonator also has the above-mentioned beneficial effects, which are not described again herein.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those ordinary skilled in the art based on the provided drawings without creative efforts.

REFERENCE SIGNS

Figure 1:
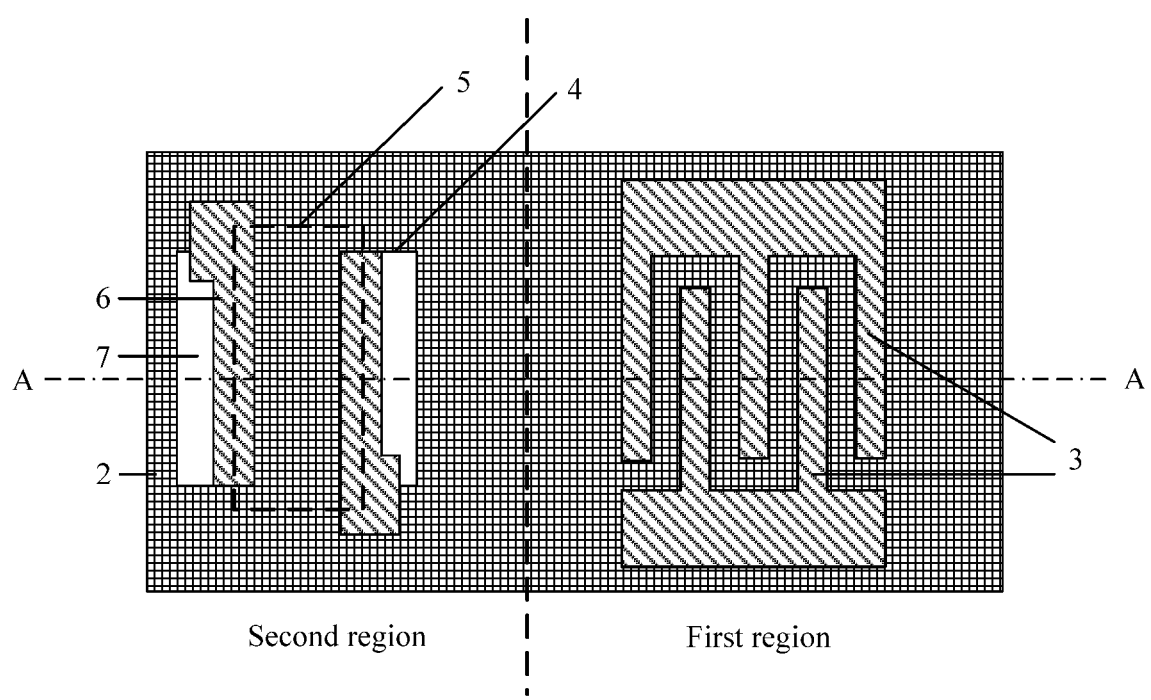
FIG. 1 is a schematic structural diagram of a top view of a hybrid acoustic resonator according to an embodiment of the present disclosure.

1: substrate,
2: piezoelectric film,
3: interdigital electrode,
4: trench,
5: bulk-acoustic-wave propagation portion,
6: bulk-acoustic-wave electrode,
61: conductive layer,
7: air gap,
8: dielectric layer,
91: first pad,
92: second pad.

DETAILED DESCRIPTION

A key of the present disclosure is to provide a hybrid acoustic resonator. In the conventional technology, an acoustic wave in a surface acoustic resonator are usually transmitted in a transversal direction at a surface of a piezoelectric film, while an acoustic wave in a bulk acoustic wave device are usually transmitted in a vertical direction along a thickness of the piezoelectric film. Generally, crystal orientation of a substrate in the resonator is required to be in a same direction as transmission of the acoustic wave in the resonator, so that a performance of the resonator meets a preset requirement. The crystal orientation of the substrate is usually along a unique direction, while the acoustic waves in the surface acoustic resonator and the bulk acoustic resonator are transmitted in different directions. Conventionally, performances of all resonators cannot be ensured in integrating the surface acoustic resonator and the bulk acoustic resonator into a same substrate.

A hybrid acoustic resonator is provided according to an embodiment of the present disclosure. An interdigital electrode is provided in a first region of a surface of a piezoelectric film facing away from a substrate, and forms an interdigital transducer. Hence, the hybrid acoustic resonator includes a surface acoustic resonator. At least two trenches are provided in a second region of the surface of the piezoelectric film facing away from the substrate. A bulk-acoustic-wave propagation portion is formed between adjacent trenches. A bulk-acoustic-wave electrode is provided on a side surface of the bulk-acoustic-wave propagation portion, and there is an air gap at the surface of the bulk-acoustic-wave electrode facing away from the bulk-acoustic-wave propagation portion. The air gap, the bulk-acoustic-wave electrode, and the bulk-acoustic-wave propagation portion constitute a bulk acoustic resonator. Thereby, the hybrid acoustic resonator includes both the surface acoustic resonator and the bulk acoustic resonator, achieving an integration of different types of resonators. In addition, an acoustic wave in the bulk-acoustic-wave propagation portion and an acoustic wave in the interdigital transducer are both transmitted along a transversal direction. Good performances of both the surface acoustic resonator and the bulk acoustic resonator are ensured in the same substrate.

Hereinafter the present disclosure is further described specifically in conjunction with the drawings and embodiments of the present disclosure. Apparently, the described embodiments are only some rather than all of the embodiments of the present disclosure. Any other embodiments obtained based on the embodiments of the present disclosure by those ordinary skilled in the art without any creative effort fall within the scope of protection of the present disclosure.

Figure 2:
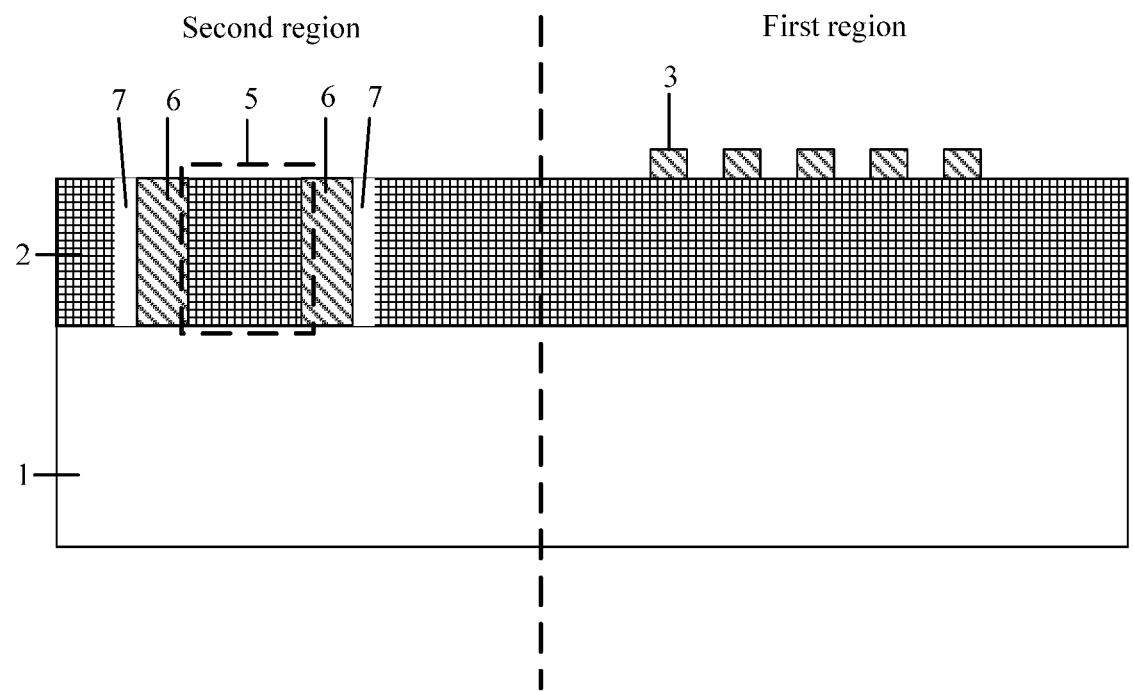
FIG. 2 is a sectional view along a line A-A in FIG. 1.

Reference is made to FIG. 1 and FIG. 2. FIG. 1 is a schematic structural diagram of a top view of a hybrid acoustic resonator according to an embodiment of the present disclosure. FIG. 2 is a sectional view along a line A-A in FIG. 1.

In an embodiment as shown in FIG. 1 and FIG. 2, the hybrid acoustic resonator includes a substrate 1, a piezoelectric film 2 located on a surface of the substrate 1, an interdigital electrode 3 located in a first region of a surface of the piezoelectric film 2 facing away from the substrate 1, at least two trenches 4 located in a second region of the surface of the piezoelectric film 2 facing away from the substrate 1, a bulk-acoustic-wave propagation portion 5 formed between the adjacent trenches 4 which includes two side surfaces opposite to each other, bulk-acoustic-wave electrodes 6 located on the side surfaces of the bulk-acoustic-wave propagation portion 5, respectively, and an air gap 7 at a surface of the bulk-acoustic-wave electrode 6 facing away from the bulk-acoustic-wave propagation portion 5.

The substrate 1 is mainly for support, and structures such as the piezoelectric film 2 need to be arranged in a certain order on the surface of the substrate 1. In an embodiment of the present disclosure, the substrate 1 may be made of silicon, sapphire, silicon carbide, glass, or the like. It is appreciated that the substrate 1 may be made of a composite material, or made of other materials. In an embodiment of the present disclosure, parameters such as material and thickness of the substrate 1 are not specifically limited.

The piezoelectric film 2 is located on the surface of the substrate 1. Generally, the piezoelectric film 2 is located on only one surface of the substrate 1. The piezoelectric film 2 is a thin film made of a piezoelectric material. The piezoelectric film 2 can achieve conversion between mechanical energy and electric energy. A voltage may be generated between two terminals of the piezoelectric film 2 in case of a pressure being applied to the piezoelectric film 2, which is a piezoelectric effect. Correspondingly, the piezoelectric film 2 may be deformed in case of a voltage being applied to the piezoelectric film 2, which is an inverse piezoelectric effect. The piezoelectric film 2 may vibrate in case of a varying voltage, such as an alternating voltage, being applied to the piezoelectric film 2. Thereby, an acoustic wave is generated in the piezoelectric film 2. It should be noted that in an embodiment of the present disclosure, the acoustic wave may propagate along the surface of the piezoelectric film 2, or along a certain direction inside the piezoelectric film 2.

In an embodiment of the present disclosure, the piezoelectric film 2 may be made of aluminum nitride (AlN), zinc oxide (ZnO), lead zirconate-titanate (PZT), lithium tantalate (LiTaO3), lithium niobate (LiNbO3), the aforementioned piezoelectric material doped with a rare-earth element, or the like. A material of the piezoelectric film 2 is described in detail in following embodiments of the present disclosure, and thus is not described in detail here.

The interdigital electrode 3 is located in the first region of the surface of the piezoelectric film 2 facing away from the substrate 1. The piezoelectric film 2 and the interdigital electrode 3 located in the first region may constitute an interdigital transducer. The interdigital transducer is configured to achieve acoustic-electrical conversion. A shape of the interdigital electrode 3 looks like alternating fingers of two hands. Generally, the interdigital electrode 3 includes two parallel buses, and electrodes that are located between the two buses and electrically connected to the two buses in an alternate manner. In operation, a voltage is applied to the interdigital electrode 3 and causes the piezoelectric film 2 to vibrate. Thereby, an acoustic wave is formed at the surface of the piezoelectric film 2, and propagates along a direction parallel to an extension line of the buses. An operation principle and a specific structure of the interdigital transducer may refer to conventional technology, and details are not described herein. A basic surface acoustic resonator (SAW resonator) may be constituted by the aforementioned interdigital transducer, and a surface acoustic wave filter may be constituted by multiple such interdigital transducers. It should be noted that in an embodiment of the present disclosure, multiple surface acoustic resonators with same or different frequencies may be provided on the surface of the piezoelectric film 2. The frequency of the surface acoustic resonator may be varied by adjusting a width and a pitch in the interdigital electrode 3.

The interdigital electrode 3 may be made of one of molybdenum (Mo), tungsten (W), chromium (Cr), titanium (Ti), aluminum (Al), copper (Cu), iridium (Ir), ruthenium (Ru), silicon (Si), graphene (Graphene), or carbon nanotube (Carbon Nanotube), or made of a composite formed by multiple materials among the above materials. In an embodiment of the present disclosure, a material of the interdigital electrode 3 is not specifically limited, which depends on a practical situation.

In an embodiment of the present disclosure, the at least two trenches 4 are provided in the second region of the surface of the piezoelectric film 2 facing away from the substrate 1. Generally, a depth of the trenches 4 is same as a thickness of the piezoelectric film 2, so as to facilitate manufacture and prevent spread of the acoustic wave that is transmitted in the bulk acoustic resonator formed between the adjacent trenches 4. Namely, the trenches 4 penetrate the piezoelectric film 2 along the thickness of the piezoelectric film 2. Generally, the multiple trenches 4 in the second region of the surface of the piezoelectric film 2 are parallel to each other in an embodiment of the present disclosure. Namely, axes of the multiple trenches 4 are parallel to each other.

The bulk-acoustic-wave propagation portion 5 is formed between the adjacent trenches 4. As indicated by the name, the acoustic wave in the bulk acoustic resonator propagates only in the bulk-acoustic-wave propagation portion 5, during operation of the hybrid acoustic resonator according to this embodiment of the present disclosure. It should be noted that the bulk-acoustic-wave propagation portion 5 includes two side surfaces, which are two opposite inner sidewalls forming the bulk-acoustic-wave propagation portion 5, and the two inner sidewalls are of two trenches 4, respectively.

The bulk-acoustic-wave electrodes 6 are provided in the trenches 4, and are located on the two side surfaces of the bulk-acoustic-wave propagation portion 5, respectively. An air gap 7 is further provided on a surface of the bulk-acoustic-wave electrode 6 facing away from the bulk-acoustic-wave propagation portion 5. The bulk-acoustic-wave propagation portion 5 generally includes two opposite side surfaces. Each side surface is provided with the bulk-acoustic-wave electrode 6, for each acoustic wave propagation portion 5. Two bulk-acoustic-wave electrodes 6 and the bulk-acoustic-wave propagation portion 5 located between the two may constitute a bulk acoustic resonator. A bulk acoustic wave (BAW) filter may be formed by multiple such bulk acoustic resonators. In an embodiment of the present disclosure, an operation frequency of the bulk acoustic resonator is related to a width of the bulk-acoustic-wave propagation portion 5. Namely, the operation frequency of the bulk acoustic resonator is related to a distance between two adjacent trenches 4. The distance between two adjacent trenches 4 may be set according to a practical situation, and is not specifically limited in an embodiment of the present disclosure. It should be noted that in an embodiment of the present disclosure, the multiple bulk acoustic resonators having same or different frequencies may be provided in the piezoelectric film 2. The frequency of the bulk acoustic resonator may be varied by adjusting the distance between adjacent trenches 4.

In an embodiment of the present disclosure, the bulk-acoustic-wave electrode 6 may be made of one of molybdenum (Mo), tungsten (W), chromium (Cr), aluminum (Al), copper (Cu), iridium (Ir), ruthenium (Ru), silicon (Si), graphene (Graphene), or carbon nanotube (Carbon Nanotube), or made of a composite formed by multiple materials among the above materials. In an embodiment of the present disclosure, a material of the bulk-acoustic-wave electrode 6 is not specifically limited, which depends on a practical situation.

The air gap 7 is configured to restrict an acoustic wave from the bulk-acoustic-wave electrode 6 to propagating within the bulk-acoustic-wave propagation portion 5. Since an acoustic impedance of air is close to zero, energy of the acoustic wave may be totally reflected. The air gap 7 is capable to effectively prevent energy of the acoustic wave from propagating laterally along the substrate 1. Thereby, spurious modes in the bulk acoustic resonator are effectively reduced, and the bulk acoustic resonator can have a higher quality factor. Generally, a width of the air gap 7 is not less than 2 μm. In an embodiment of the present disclosure, the width of the air gap 7 is not greater than 30 μm, so as to shrink die size of the hybrid acoustic resonator.

It can be understood that more than one bulk-acoustic-wave electrode 6 may be provided in each of the trenches 4. Taking three parallel trenches 4 as an example, two bulk-acoustic-wave propagation portions 5 may be formed among the three parallel trenches 4, and two inner sidewalls of the middle trench 4 are side surfaces of two different bulk-acoustic-wave propagation portions 5, respectively. Thus, the two inner sidewalls of the middle trench 4 are both provided with bulk-acoustic-wave electrode 6, and there are two bulk-acoustic-wave electrodes 6 in total in such trench 4. It should be noted that it is necessary to provide the air gap 7 between the two bulk-acoustic-wave electrodes 6 located in the same trench 4.

A hybrid acoustic resonator is provided according to an embodiment of the present disclosure. The interdigital electrode 3 is provided in the first region of the surface of the piezoelectric film 2 facing away from the substrate 1, and forms an interdigital transducer. Hence, the hybrid acoustic resonator includes a surface acoustic resonator. At least two trenches 4 are provided in the second region of the surface of the piezoelectric film 2 facing away from the substrate 1. The bulk-acoustic-wave propagation portion 5 is formed between adjacent trenches 4. The bulk-acoustic-wave electrode 6 is provided on the side surface of the bulk-acoustic-wave propagation portion 5, and there is the air gap 7 at the surface of the bulk-acoustic-wave electrode 6 facing away from the bulk-acoustic-wave propagation portion 5. The air gap 7, the bulk-acoustic-wave electrode 6, and the bulk-acoustic-wave propagation portion 5 constitute a bulk acoustic resonator. Thereby, the hybrid acoustic resonator includes both the surface acoustic resonator and the bulk acoustic resonator, achieving an integration of different types of resonators. In addition, an acoustic wave in the bulk-acoustic-wave propagation portion 5 and an acoustic wave in the interdigital transducer are both transmitted along a transversal direction. Good performances of both the surface acoustic resonator and the bulk acoustic resonator are ensured in the same substrate 1.

A specific structure of a hybrid acoustic resonator is described in detail in following embodiments of the present disclosure.

Figure 3:
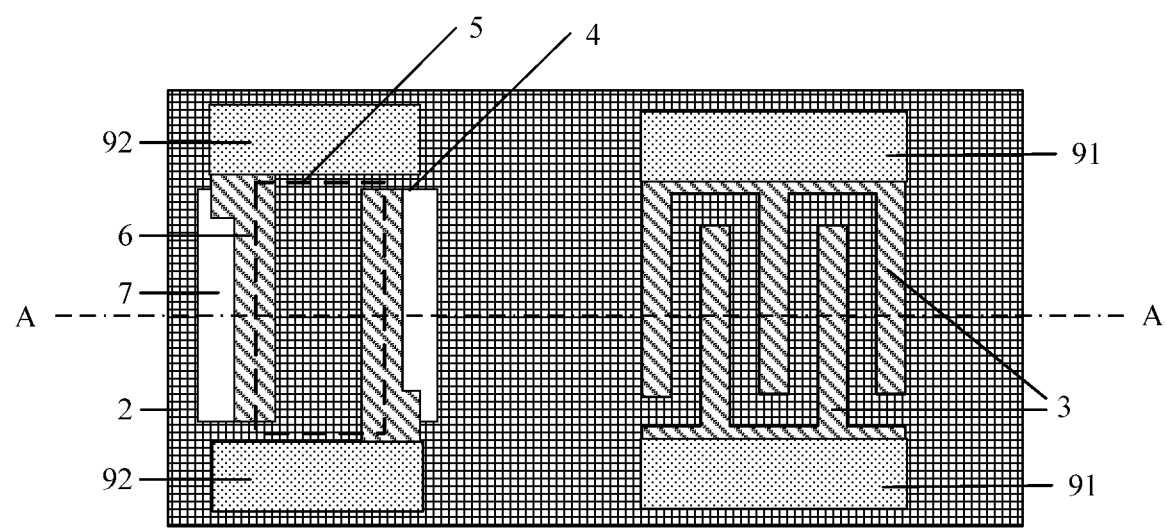
FIG. 3 is a schematic structural diagram of a hybrid acoustic resonator according to an embodiment of the present disclosure.
Figure 4:
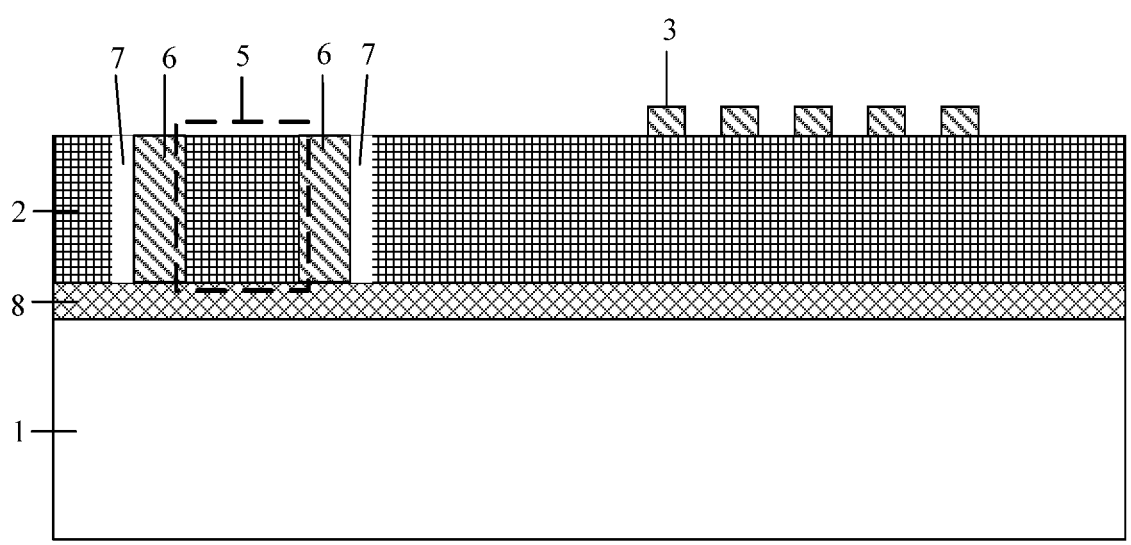
FIG. 4 is a sectional view along a line A-A in FIG. 3.

Reference is made to FIG. 3 and FIG. 4. FIG. 3 is a schematic structural diagram of a hybrid acoustic resonator according to an embodiment of the present disclosure. FIG. 4 is a sectional view along a line A-A in FIG. 3.

This embodiment is based on the aforementioned embodiments of the present disclosure, and differs in that a structure of the hybrid acoustic resonator is further defined. The parts which have been described in detail in the aforementioned embodiments of the present disclosure are not described again herein.

Referring to FIG. 3 and FIG. 4, the piezoelectric film 2 in the hybrid acoustic resonator may be a single crystal piezoelectric film 2 in an embodiment of the present disclosure. A coupling coefficient of the single crystal piezoelectric film 2, such as a single crystal lithium niobate film or a single crystal lithium tantalate film, is strong in a transversal direction that is parallel to the surface of the substrate 1. Such transversal direction is also a propagation direction of acoustic waves in the surface acoustic resonator and the bulk acoustic resonator of the hybrid acoustic resonator, according to this embodiment of the present disclosure. Namely, the acoustic waves in the bulk acoustic resonator and the surface acoustic resonator both propagate in a direction of a large coupling coefficient in the single crystal piezoelectric film 2. Thereby, both the bulk acoustic resonator and the surface acoustic resonator have a high quality factor in the hybrid acoustic resonator, which is manufactured with the single crystal piezoelectric film 2 having a large transversal coupling coefficient.

In an embodiment of the present disclosure, the resonator may further include a dielectric layer 8 located between the substrate 1 and the piezoelectric film 2, and the temperature coefficient of frequency of the dielectric layer 8 is positive. The positive temperature coefficient of frequency (TCF) refers to that an inherent frequency of the dielectric layer 8 increases as a temperature increases, namely, the inherent frequency of the dielectric layer 8 has a positive correlation with the temperature. Generally, temperature coefficient of frequency of materials in other structures are negative in the hybrid acoustic resonator according to embodiments of the present disclosure. Given a change in an ambient temperature in such cases, the inherent frequency of the materials currently used in the resonator decreases with an increase of the ambient temperature, affecting temperature stability of the hybrid acoustic resonator. The dielectric layer 8 with the positive temperature coefficient of frequency is provided between the substrate 1 and the piezoelectric film 2, effectively improving the temperature coefficient of the resonator. Thereby, the inherent frequency of the resonator does not fluctuate distinctly as the ambient temperature changes, and the temperature stability of the resonator is good.

In an embodiment of the present disclosure, the dielectric layer 8 may be made of silicon oxide ($SiO_2$), silicon oxide doped with fluorine (F), silicon oxide doped with boron (B), or the like. In an embodiment of the present disclosure, a material of the dielectric layer 8 is not specifically limited.

In an embodiment of the present disclosure, the resonator may further include multiple first pads 91 and multiple second pads 92 on the surface of the piezoelectric film 2 facing away from the substrate 1. The first pad 91 is electrically connected to a bus in the interdigital electrode 3. The second pad 92 is electrically connected to the bulk-acoustic-wave electrode 6.

Generally, the first pad 91 serves as a connection point between the surface acoustic resonator and another component, and the second pad 92 serves a connection point between the bulk acoustic wave device and another component, in the hybrid acoustic resonator according to an embodiment of the present disclosure. The first pads 91 and the second pads 92 are provided on the surface of the piezoelectric film 2 facing away from the substrate 1. The first pads 91 are required to be in a one-to-one correspondence with the buses in the interdigital electrode 3. The first pad 91 is required to be in contact with the corresponding bus, so as to electrically connect with the interdigital electrode 3. The second pads 92 are required to be in a one-to-one correspondence with the bulk-acoustic-wave electrodes 6. The second pad 92 is required to be in contact with the corresponding bulk-acoustic-wave electrode 6, so as to electrically connect with the bulk-acoustic-wave electrode 6.

In an embodiment of the present disclosure, the first pads 91 and the second pads 92 may be made of one of chromium (Cr), nickel (Ni), tungsten (W), titanium tungsten (TiW), aluminum (Al), copper (Cu), or gold (Au), or made of a composite formed by multiple materials among the above materials. In an embodiment of the present disclosure, the materials of the first pads 91 and the second pads 92 are not specifically limited, which depends on a practical situation.

Generally, reflection gratings are provided at two sides of the interdigital electrode 3 in an embodiment of the present disclosure. The reflection gratings are arranged along an extension direction of the buses in the first region of the surface of the piezoelectric film 2 facing away from the substrate 1. The reflection gratings are configured to reflect an acoustic wave. The acoustic wave in the surface acoustic resonator can be trapped within the interdigital transducer by the reflection grating, thereby preventing energy of the acoustic wave from losing at the two sides of the interdigital transducer.

The hybrid acoustic resonator is provided according to embodiments of the present disclosure. High quality factors of both the bulk acoustic resonator and the surface acoustic resonator are ensured, by applying the single crystal piezoelectric film 2. The inherent frequency of the resonator does not fluctuate distinctly with the change of the ambient temperature, by providing the dielectric layer 8 with a positive temperature coefficient of frequency. The hybrid acoustic wave device may be electrically connected to other components, by providing the first pads 91 and the second pads 92.

Hereinafter a method for manufacturing a hybrid acoustic resonator is described according to an embodiment of the present disclosure. The method described below may refer to the structure of the aforementioned hybrid acoustic resonators.

Reference is made to FIG. 5 to FIG. 9. FIG. 5 to FIG. 9 are a flow charts and process diagrams of a method for manufacturing a hybrid acoustic resonator according to an embodiment of the present disclosure.

Figure 5:
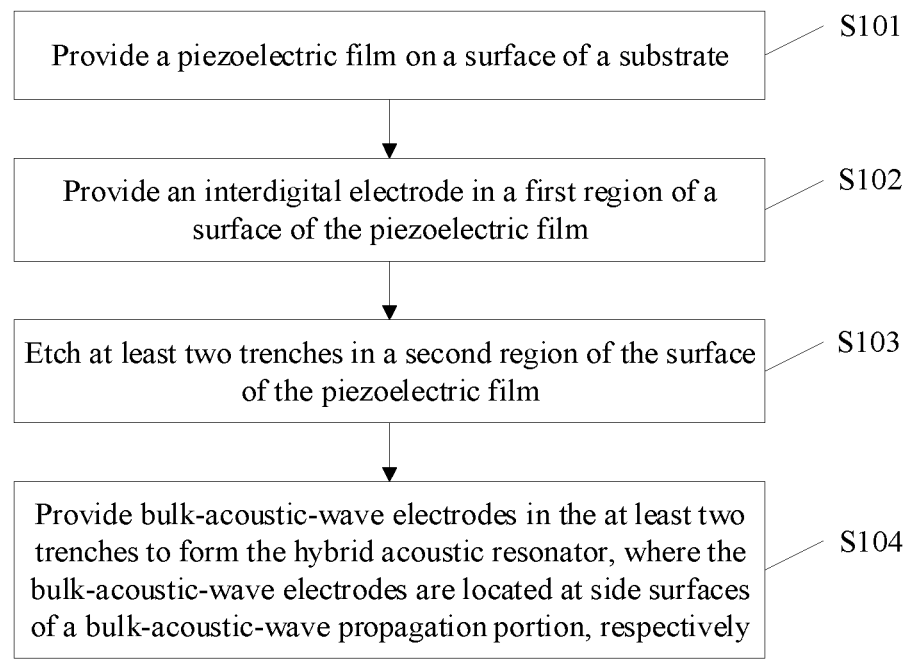
FIGS. 5 to 9 are a flowchart and processing diagrams of a method for manufacturing a hybrid acoustic resonator according to an embodiment of the present disclosure.

As shown in FIG. 5, the method for manufacturing the hybrid acoustic resonator according to an embodiment of the present disclosure includes steps S101 to S104.

In S101, a piezoelectric film is provided on a surface of a substrate.

Figure 6:
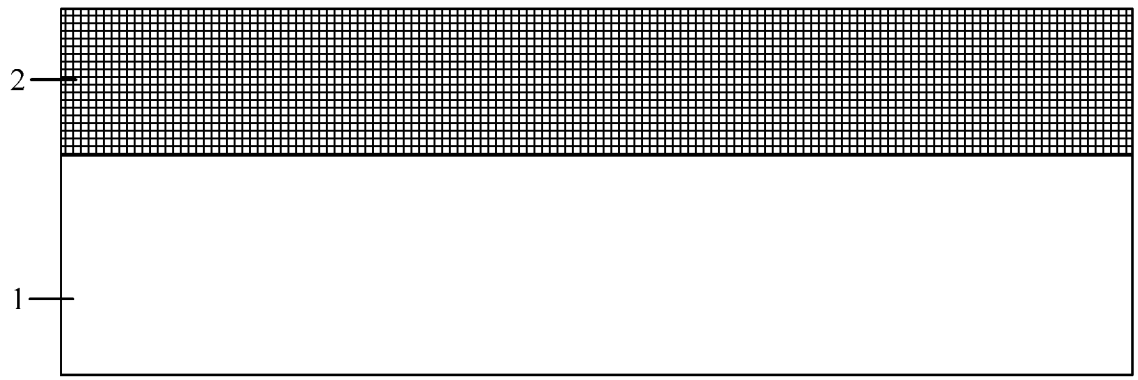

Reference is made to FIG. 6. In this step, the piezoelectric film 2 is generally prepared in advance, and then bonded to the surface of the pre-prepared substrate 1. In an embodiment of the present disclosure, a specific method for bonding may refer to conventional technology, which is not limited herein.

Materials of the substrate 1 and the piezoelectric film 2 have been described in detail in the foregoing embodiments of the present disclosure, and are not described again herein. It should be noted that the surface of the piezoelectric film 2 is generally divided into a first region and a second region.

Generally, the piezoelectric film 2 is grinded and polished after this step, so that the piezoelectric film 2 reaches a preset thickness. Generally, the preset thickness is determined by a maximum area occupied by a single bulk acoustic resonator included in a bulk acoustic wave (BAW) filter. For example, in a case that the maximum area occupied by the bulk acoustic resonator is S, a thickness of the piezoelectric film 2 is required to be greater than or equal to $\sqrt{S}/10$ after being grinded and polished.

The piezoelectric film 2 may be thinned in another manner besides the grinding and polishing as described above. A bonding surface of the piezoelectric film 2 may be implanted with specific ions before the bonding, so as to form a modified layer with the preset thickness. Then after bonding, the piezoelectric thin film 2 may be separated at the modified layer through low temperature annealing. Thereby, the piezoelectric film 2 with the preset thickness is left and fixedly connected to the substrate 1, achieving thinning of the piezoelectric film 2.

In S102, an interdigital electrode is provided in the first region of the surface of the piezoelectric film.

Figure 7:
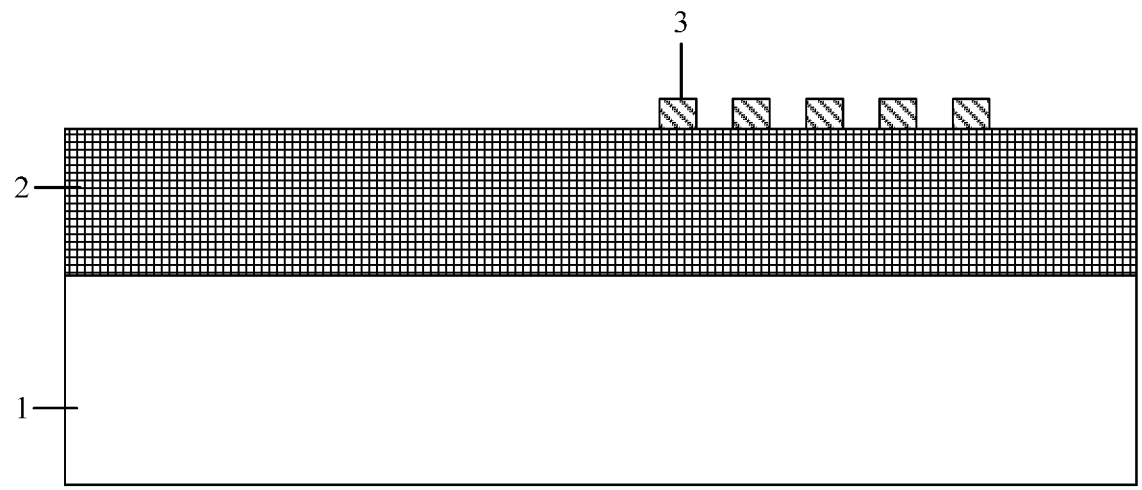

Reference is made to FIG. 7. In this step, the interdigital electrode 3 needs to be provided in the first region of the surface of the piezoelectric film 2, so as to form an interdigital transducer. A basic surface acoustic resonator can be constituted by the interdigital transducer. A specific structure of the interdigital transducer has been described in detail in the aforementioned embodiments of the present disclosure, which is not repeated herein.

In this step, the interdigital electrode 3 may be provided on the first region of the surface of the piezoelectric film 2 in various manners. For example, in a first manner, a conductive layer is sputtered on the surface of the piezoelectric thin film 2, and then the conductive layer is patterned through etching. Thereby, the interdigital electrode 3 is formed in the first region of the surface of the piezoelectric film 2.

In a second manner, a photoresist may be first provided on the surface of the piezoelectric film 2. Then, the photoresist is patterned to expose a region of the piezoelectric film 2 at which the interdigital electrode 3 is to be provided. Afterwards, a conductive layer is sputtered on a surface of the photoresist, and the conductive layer also covers the exposed region of the piezoelectric film 2 at which the interdigital electrode 3 is to be provided. Finally, the photoresist is removed, and the conductive layer covering the surface of the photoresist is also removed. Thereby, the interdigital electrode 3 is formed in the first region of the surface of the piezoelectric film 2.

It is appreciated that the interdigital electrode 3 may be provided in another manner besides the above two. In an embodiment of the present disclosure, a specific method for disposing the interdigital electrode 3 is not limited. In an embodiment of the present disclosure, a manner for providing interdigital electrode 3 may be flexibly selected from different manners according to a practical situation.

In S103, at least two trenches are etched in the second region of the surface of the piezoelectric film.

Figure 8:
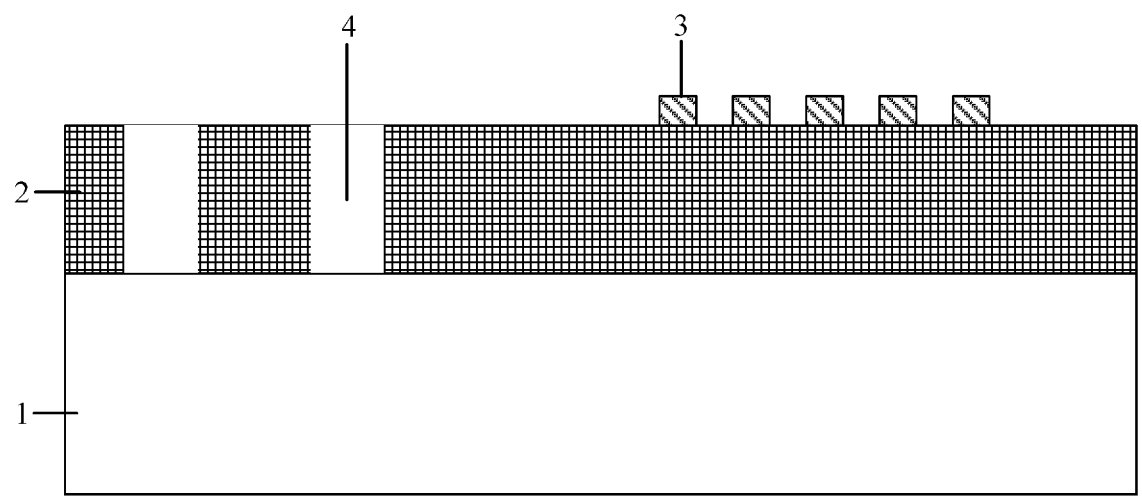

Reference is made to FIG. 8. In an embodiment of the present disclosure, a bulk-acoustic-wave propagation portion 5 is formed between the adjacent trenches 4, and the bulk-acoustic-wave propagation portion 5 includes two opposite side surfaces.

In this step, the trench 4 is formed by etching the second region of the surface of the piezoelectric film 2. A specific structure of the trench 4 has been described in detail in the aforementioned embodiments of the present disclosure, and is not described again herein. In this step, the piezoelectric film 2 is usually etched through. A specific etching process may refer to conventional technology, and details are not described herein.

In an embodiment of the present disclosure, an operation frequency of the bulk acoustic resonator is related to a width of the bulk-acoustic-wave propagation portion 5, namely, related to a distance between adjacent trenches 4. Hence, the distance between the trenches 4 in this step is selected according to designs of different applications, and is not specifically limited in an embodiment of the present disclosure.

In S104, bulk-acoustic-wave electrodes are provided in the at least two trenches, to form the hybrid acoustic resonator. The bulk-acoustic-wave electrodes are located at the two side surfaces of the bulk-acoustic-wave propagation portion, respectively.

Figure 9:
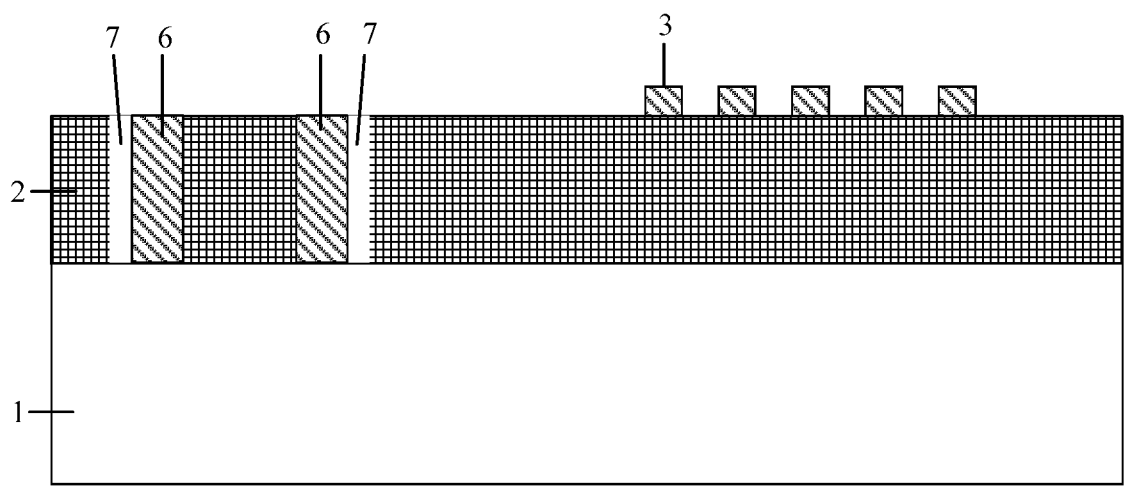

Reference is made to FIG. 9. In an embodiment of the present disclosure, there is an air gap 7 at a surface of each bulk-acoustic-wave electrode 6 facing away from the bulk-acoustic-wave propagation portion 5.

In this step, the bulk-acoustic-wave electrodes 6 located on side surfaces of the bulk-acoustic-wave propagation portion 5 are formed in the trench 4. Generally, each of the two side surfaces of each bulk-acoustic-wave propagation portion 5 needs to be provided with the bulk-acoustic-wave electrode 6. It should be noted that generally there should be the air gap 7, configured to restrict propagation of the acoustic wave, at the surface of the bulk-acoustic-wave electrode 6 facing away from the bulk-acoustic-wave propagation portion 5. Thereby, manufacture of the hybrid acoustic resonator according to an embodiment of the present disclosure is finally completed. Specific steps for providing the bulk-acoustic-wave electrode 6 and the air gap 7 are described in detail in following embodiments of the present disclosure, and are not described here.

It should be noted that, in an embodiment of the present disclosure, S102 is a step mainly for forming the surface acoustic resonator, and S103 and S104 are steps mainly for forming the bulk acoustic resonator. An order of performing S103 and S104 with respect to performing S102 is not limited. In an embodiment of the present disclosure, the interdigital electrode 3 may be first formed on the surface of the piezoelectric film 2 to form the surface acoustic resonator, and then the bulk-acoustic-wave electrodes 6 may be provided in the piezoelectric film 2 to form the bulk acoustic resonator. Alternatively, the bulk-acoustic-wave electrodes 6 are first provided in the piezoelectric thin film 2 to form the bulk acoustic resonator, and then the interdigital electrode 3 is formed on the surface of the piezoelectric thin film 2 to form the surface acoustic resonator. In an embodiment of the present disclosure, a specific order may be set according to a practical situation, and is not limited herein.

The method for manufacture the hybrid acoustic resonator is provided according to an embodiment of the present disclosure. In the manufactured hybrid acoustic resonator, the interdigital electrode 3 is provided in the first region of the surface of the piezoelectric film 2 facing away from the substrate 1, and forms an interdigital transducer. Hence, the hybrid acoustic resonator includes a surface acoustic resonator. At least two trenches 4 are provided in the second region of the surface of the piezoelectric film 2 facing away from the substrate 1. The bulk-acoustic-wave propagation portion 5 is formed between adjacent trenches 4. The bulk-acoustic-wave electrode 6 is provided on the side surface of the bulk-acoustic-wave propagation portion 5, and there is the air gap 7 at the surface of the bulk-acoustic-wave electrode 6 facing away from the bulk-acoustic-wave propagation portion 5. The air gap 7, the bulk-acoustic-wave electrode 6, and the bulk-acoustic-wave propagation portion 5 constitute a bulk acoustic resonator. Thereby, the hybrid acoustic resonator includes both the surface acoustic resonator and the bulk acoustic resonator, achieving an integration of different types of resonators. In addition, an acoustic wave in the bulk-acoustic-wave propagation portion 5 and an acoustic wave in the interdigital transducer are both transmitted along a transversal direction. Good performances of both the surface acoustic resonator and the bulk acoustic resonator are ensured in the same substrate 1.

Specific steps of manufacturing the hybrid acoustic resonator are described in detail in following embodiments of the present disclosure.

Reference is made to FIG. 10 to FIG. 16. FIG. 10 to FIG. 16 are a flow chart and process diagrams of a method for manufacturing a hybrid acoustic resonator according to an embodiment of the present disclosure.

Figure 10:
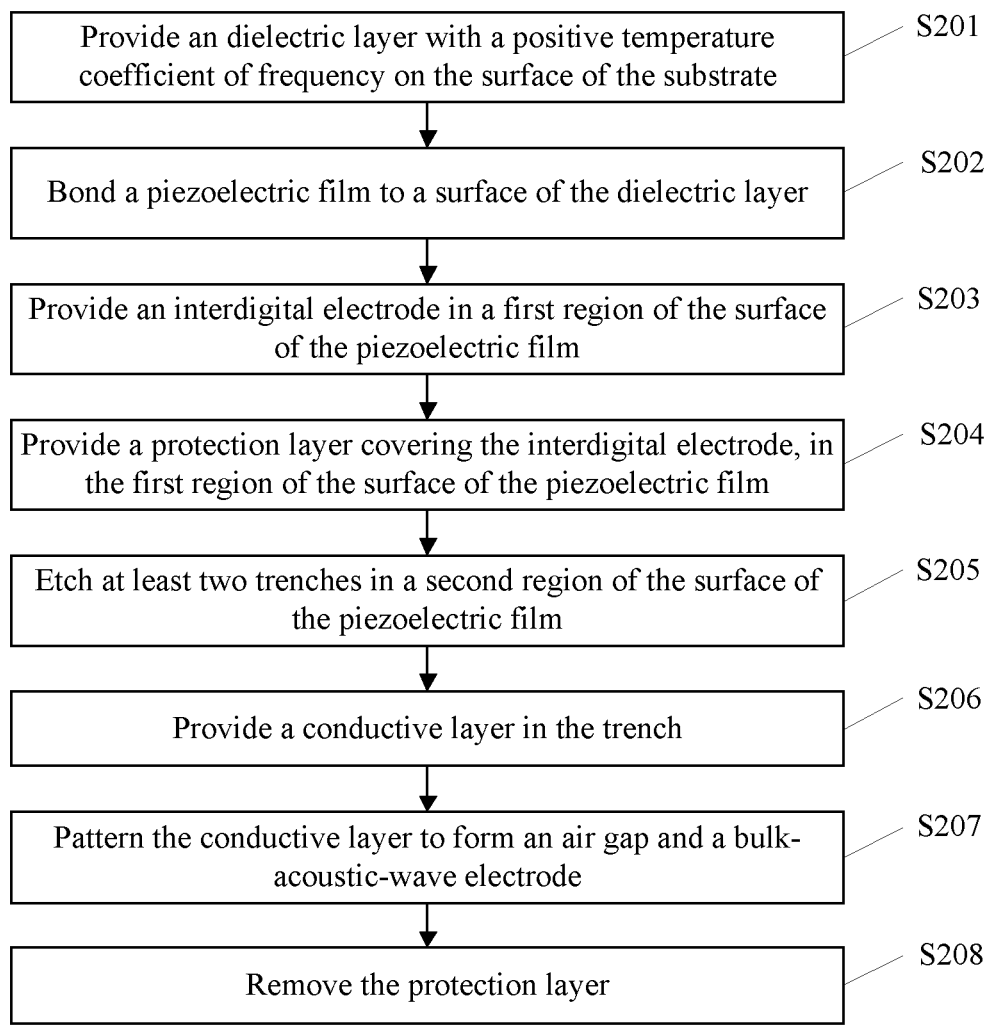
FIGS. 10 to 16 are a flowchart and processing diagrams of a method for manufacturing a hybrid acoustic resonator according to an embodiment of the present disclosure.

Reference is made to FIG. 10. In an embodiment of the present disclosure, the method for manufacturing the hybrid acoustic resonator includes steps S201 to S208.

In S201, a dielectric layer with a positive temperature coefficient of frequency is provided on a surface of the substrate.

Figure 11:
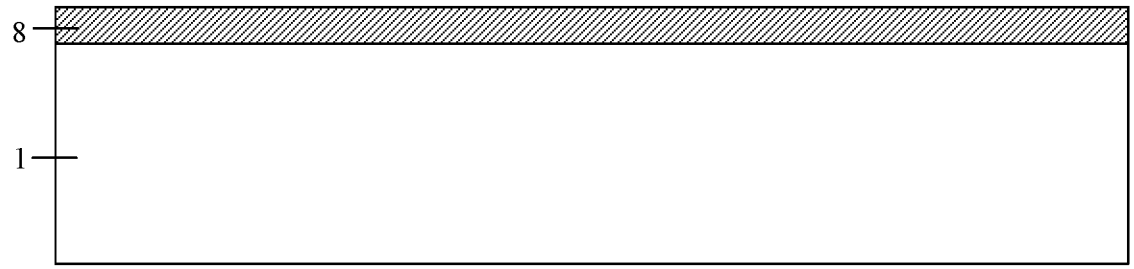

Reference is made to FIG. 11. A material and function of the dielectric layer 8 have been described in detail in the aforementioned embodiment of the present disclosure, and are not described again herein. In this step, the dielectric layer 8 with positive temperature coefficient of frequency is deposited on the surface of the substrate 1 through thin-film deposition. Depositing the dielectric layer 8 on the surface of the substrate 1 further facilitate subsequent bonding of the piezoelectric film 2.

In S202, the piezoelectric film is bonded on a surface of the dielectric layer.

Figure 12:
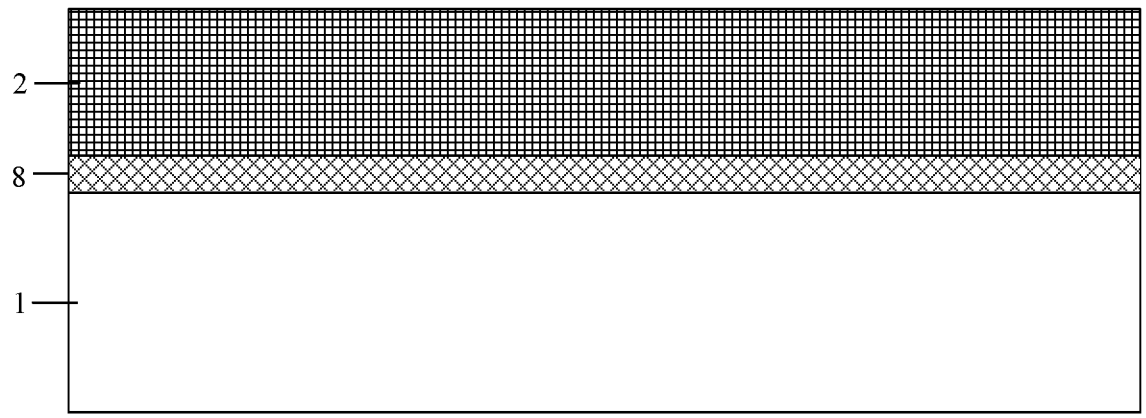

Reference is made to FIG. 12. In this step, the piezoelectric film 2 is bonded on the surface of the dielectric layer 8, so that the piezoelectric film 2 is fixedly connected to the substrate 1. Other parts of this step are basically same as the step S101 in the foregoing embodiment of the present disclosure, to which details can refer and are not described again herein.

In S203, an interdigital electrode is provided in a first region of a surface of the piezoelectric film.

Figure 13:
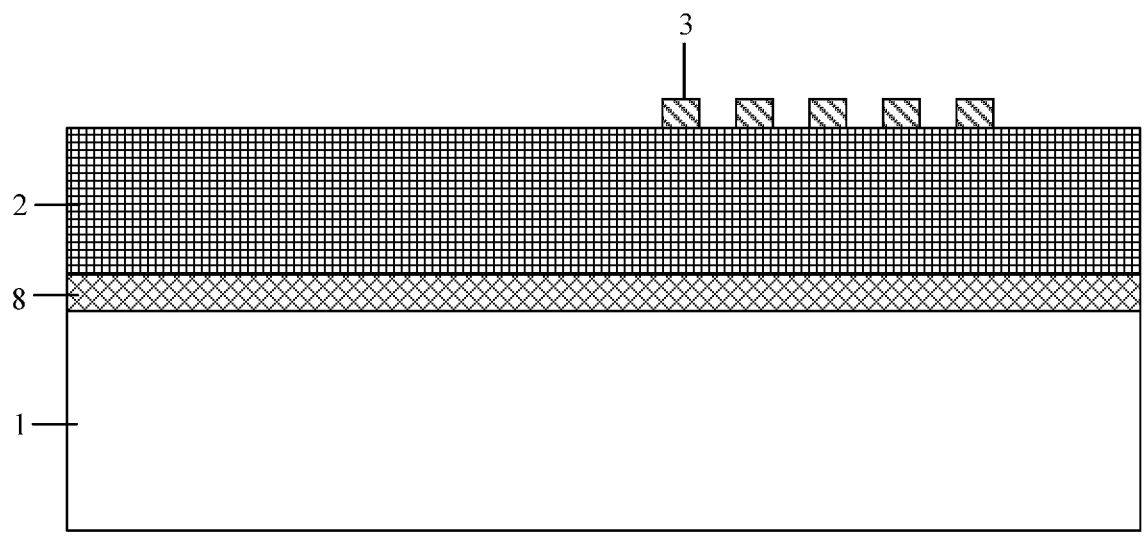

Reference is made to FIG. 13. This step is basically same as the step S102 in the foregoing embodiment of the present disclosure. Details have been described in the foregoing embodiment of the present disclosure, and are not described again herein.

In S204, a protection layer covering the interdigital electrode is provided in the first region of the surface of the piezoelectric film.

In this step, the surface of the interdigital electrode 3 that has been provided is covered with a protection layer before manufacturing the bulk acoustic resonator. Thereby, it is prevented that morphology of the interdigital electrode 3 is affected in subsequent manufacture of the bulk acoustic resonator, and it is prevented that a performance of the surface acoustic wave device is affected. The protection layer may be a photoresist or the like. A specific material and a thickness of the protection layer may refer to conventional technology, and details are not described herein.

In S205, at least two trenches are etched in a second region of the surface of the piezoelectric film after the interdigital electrode is provided.

Figure 14:
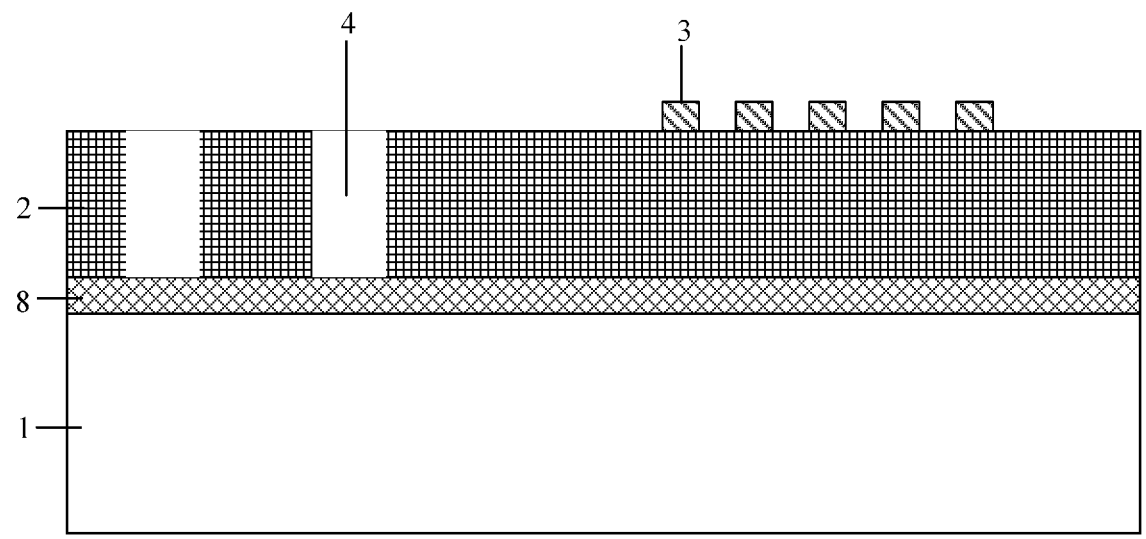

Reference is made to FIG. 14. In an embodiment of the present disclosure, the interdigital electrode 3 is firstly formed on the surface of the piezoelectric film 2 to form the surface acoustic resonator, and then bulk-acoustic-wave electrodes 6 are provided in the piezoelectric film 2 to form the bulk acoustic resonator. In a case that the trenches 4 and the bulk-acoustic-wave electrodes 6 are provided first, the surface of the piezoelectric film 2 are no longer flat. A flat surface of the piezoelectric film 2 is preferable for providing the interdigital electrode 3 on the surface of the piezoelectric film. Therefore in general, the interdigital electrode 3 is firstly formed on the surface of the piezoelectric film 2 to form the surface acoustic resonator, and then the bulk-acoustic-wave electrodes 6 are provided in the piezoelectric film 2 to form the bulk acoustic resonator, in this embodiment of the present disclosure.

Other parts of this step are basically same as the step S103 in the foregoing embodiment of the present disclosure. Details may refer to the foregoing embodiment of the present disclosure, and are not described again herein.

In S206, a conductive layer is provided in the trench.

Figure 15:
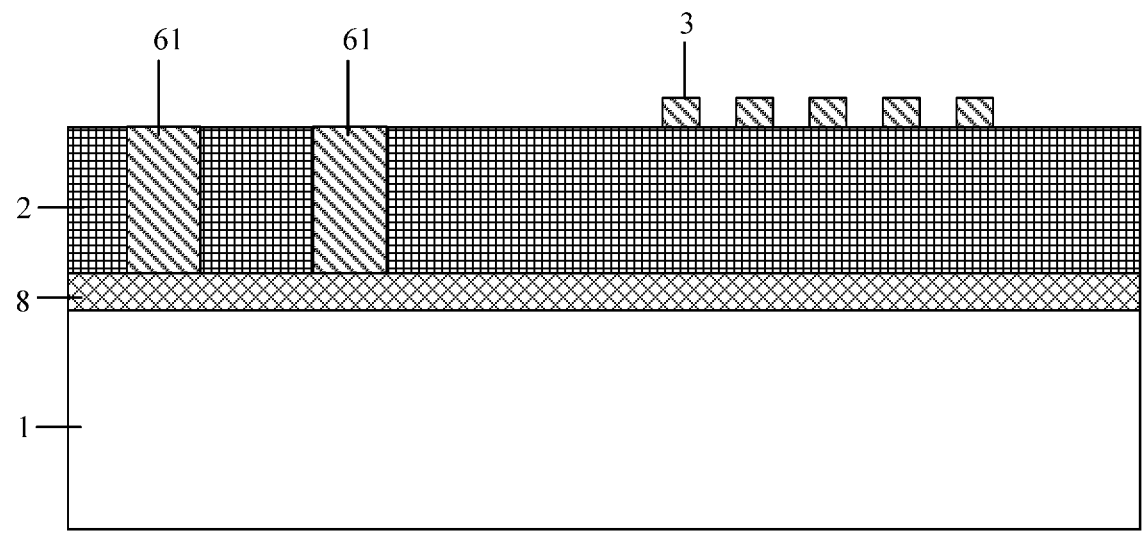

Reference is made to FIG. 15. In this step, the conductive layer 61 may be deposited in the trench through atomic layer deposition (ALD), electroplating, or sputtering process with good step coverage. The conductive layer 61 may fill the entire trench 4, or may cover only a bottom and sidewalls of the trench 4. A specific material of the conductive layer 61 may refer to the material of the bulk-acoustic-wave electrodes 6 in the foregoing embodiment of the present disclosure, and details are not described again herein.

In S207, the conductive layer is patterned to form an air gap and a bulk-acoustic-wave electrode.

Figure 16:
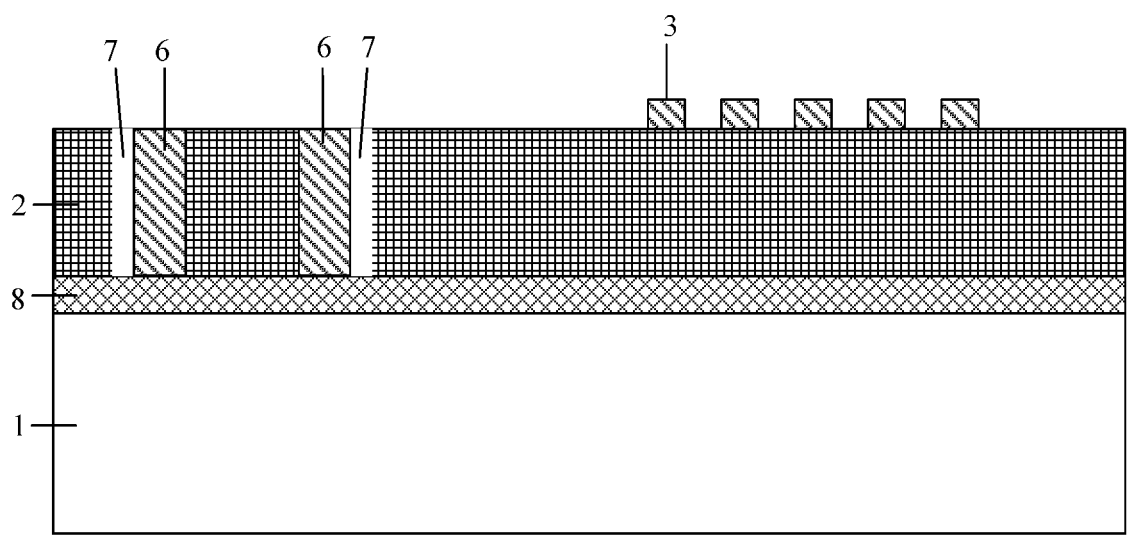

Reference is made to FIG. 16. In this step, the conductive layer 61 disposed in the trench 4 may be patterned through lift off or etching, so as to form the air gap 7 described in the aforementioned embodiment of the present disclosure, and treat the conductive layer 61 into the bulk-acoustic-wave electrode 6. A specific process for patterning may refer to conventional technology, of which details are not described again herein.

In S208, the protection layer is removed.

In this step, the protection layer provided in the step S204 is removed to expose the interdigital electrode 3. It is appreciated that this step is not necessary in following cases. For example, the protection layer is not provided on the surface of the interdigital electrode 3 before the step S208. For another example, the protection layer, such as a silicon oxide layer, can be utilized for temperature compensation and is not necessary to be removed.

After this step, the first pads 91 and the second pads 92 according to the aforementioned embodiment of the present disclosure may be further provided on the surface of the piezoelectric film 2. A specific process for manufacturing the first pads 91 and the second pads 92 may refer to conventional technology, of which details are not described again herein.

The method for manufacturing the hybrid acoustic resonator is provided according to an embodiment of the present disclosure. An inherent frequency of the resonator can be prevented from fluctuating distinctly with a change in an ambient temperature, by providing the dielectric layer 8 with the positive temperature coefficient of frequency. The interdigital electrode 3 is prevented from being easily damaged in subsequent steps, by providing the protection layer. A good shape of the interdigital electrode 3 is effectively ensured, by providing the interdigital electrode 3 before providing the bulk-acoustic-wave electrodes 6.

The embodiments in the specification are described in a progressive way, and each embodiment lays emphasis on differences from other embodiments. Same or similar parts between various embodiments may refer to each other. Since devices disclosed in the embodiments correspond to methods disclosed in the embodiments, the description of the devices is simple, and reference may be made to the relevant part of the methods.

As further be appreciated by those skilled in the art, the units and algorithmic steps in the examples described according to the embodiments disclosed herein can be implemented in forms of electronic hardware, computer software or the combination of the both. To illustrate the interchangeability of the hardware and the software clearly, the components and the steps in the examples are described generally according to functions in the above description. Whether hardware or software is used to implement the functions depends on a specific application and design constraints for the technical solution. For each specific application, different methods may be used by those skilled in the art to implement the described function, and such implementation should not be considered to depart from the scope of this invention.

The steps of the method or algorithm described according to the embodiments disclosed herein can be implemented in forms of hardware, a software module executed by a processor or the combination of the both. The software module may be stored in a Random Access Memory (RAM), a memory, a Read-Only Memory (ROM), an electrically programmable ROM, an electrically erasable programmable ROM, a register, a hardware disk, a movable magnetic disk, CD-ROM or any other forms of storage medium well known in the art.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other similar elements may exist in the process, the method, the article or the device other than enumerated elements.

Hereinabove the hybrid acoustic resonator and the method for manufacturing the hybrid acoustic resonator according to the embodiments of the present disclosure are described in detail. The principle and implementation of the present disclosure are described by using specific examples. The description of the above embodiments is merely intended to help understand the method and the key concepts of the present disclosure. It should be noted that those skilled in the art may make some variations and improvements to the present disclosure without departing from the principle of the present disclosure, and such variations and improvements fall within the protection scope of the claims of the present disclosure.

The invention claimed is:

1. A hybrid acoustic resonator, comprising:
   a substrate;
   a piezoelectric film on a surface of the substrate;
   an interdigital electrode located in a first region of a surface of the piezoelectric film facing away from the substrate;
   at least two trenches located in a second region of the surface of the piezoelectric film facing away from the substrate, wherein a bulk-acoustic-wave propagation portion is formed between adjacent ones of the at least two trenches, and the bulk-acoustic-wave propagation portion comprises two side surfaces opposite to each other; and
   bulk-acoustic-wave electrodes are provided in the at least two trenches, wherein the bulk-acoustic-wave electrodes are located on the two side surfaces of the bulk-acoustic-wave propagation portion, respectively, wherein there is an air gap at a surface of each of the bulk-acoustic-wave electrodes facing away from the bulk-acoustic-wave propagation portion.

2. The hybrid acoustic resonator according to claim 1, wherein the at least two trenches are parallel to each other.

3. The hybrid acoustic resonator according to claim 2, wherein a width of the air gap is not less than 2 µm.

4. The hybrid acoustic resonator according to claim 3, further comprising:
   a dielectric layer located between the substrate and the piezoelectric film, wherein the temperature coefficient of frequency of the dielectric layer is positive.

5. The hybrid acoustic resonator according to claim 2, further comprising:
   a dielectric layer located between the substrate and the piezoelectric film, wherein the temperature coefficient of frequency of the dielectric layer is positive.

6. The hybrid acoustic resonator according to claim 1, wherein the piezoelectric film is a single crystal piezoelectric film.

7. The hybrid acoustic resonator according to claim 6, further comprising:
   a dielectric layer located between the substrate and the piezoelectric film, wherein the temperature coefficient of frequency of the dielectric layer is positive.

8. The hybrid acoustic resonator according to claim 1, further comprising:
   a dielectric layer located between the substrate and the piezoelectric film, wherein the temperature coefficient of frequency of the dielectric layer is positive.

9. The resonator according to claim 1, further comprising
   a plurality of first pads; and
   a plurality of second pads;
   wherein the plurality of first pads and the plurality of second pads are located on the surface of the piezoelectric film facing away from the substrate;
   wherein the plurality of first pads is electrically connected to a bus of the interdigital electrode; and
   wherein the plurality of second pads is electrically connected to the bulk-acoustic-wave electrodes.

10. A method for manufacturing a hybrid acoustic resonator, comprising:
    providing a piezoelectric film on a surface of a substrate;
    providing an interdigital electrode in a first region of a surface of the piezoelectric film;
    etching at least two trenches in a second region of the surface of the piezoelectric film, wherein a bulk-acoustic-wave propagation portion is formed between adjacent ones of the at least two trenches, and the bulk-acoustic-wave propagation portion comprises two side surfaces opposite to each other;
    providing bulk-acoustic-wave electrodes in the at least two trenches, to form the hybrid acoustic resonator, wherein the bulk-acoustic-wave electrodes are located at the two side surfaces of the bulk-acoustic-wave propagation portion, respectively, and there is an air gap at a surface of each of the bulk-acoustic-wave electrodes facing away from the bulk-acoustic-wave propagation portion.

11. The method according to claim 10, wherein providing the bulk-acoustic-wave electrodes in the at least two trenches comprises:
    providing a conductive layer in the at least two trenches; and
    patterning the conductive layer, to form the air gaps and the bulk-acoustic-wave electrodes.

12. The method according to claim 11, wherein:
    after the providing the interdigital electrode in the first region of the surface of the piezoelectric film, the method further comprises:
       providing a protection layer covering the interdigital electrode, in the first region of the surface of the piezoelectric film;
    etching the at least two trenches in the second region of the surface of the piezoelectric film comprises:
       etching, after providing the interdigital electrode, the at least two trenches in the second region of the surface of the piezoelectric film; and
    after providing the interdigital electrode in the first region of the surface of the piezoelectric film, the method further comprises:
       removing the protection layer.

13. The method according to claim 10, wherein:
    before the providing the piezoelectric film on the surface of the substrate, the method further comprises:
       providing a dielectric layer on the surface of the substrate, wherein a temperature coefficient of frequency of the dielectric layer is positive; and
    providing the piezoelectric film on the surface of the substrate comprises:
       bonding the piezoelectric film to a surface of the dielectric layer.

14. The method according to claim 13, wherein:
    after the providing the interdigital electrode in the first region of the surface of the piezoelectric film, the method further comprises:
       providing a protection layer covering the interdigital electrode, in the first region of the surface of the piezoelectric film;
    etching the at least two trenches in the second region of the surface of the piezoelectric film comprises:
       etching, after providing the interdigital electrode, the at least two trenches in the second region of the surface of the piezoelectric film; and after providing the interdigital electrode in the first region of the surface of the piezoelectric film, the method further comprises:
removing the protection layer.

15. The method according to claim 10, wherein:
after the providing the interdigital electrode in the first region of the surface of the piezoelectric film, the method further comprises:
providing a protection layer covering the interdigital electrode, in the first region of the surface of the piezoelectric film;
etching the at least two trenches in the second region of the surface of the piezoelectric film comprises:
etching, after providing the interdigital electrode, the at least two trenches in the second region of the surface of the piezoelectric film; and
after providing the interdigital electrode in the first region of the surface of the piezoelectric film, the method further comprises:
removing the protection layer.

* * * * *